(12) United States Patent
Docter et al.

(10) Patent No.: US 6,214,678 B1
(45) Date of Patent: *Apr. 10, 2001

(54) GROWTH TECHNIQUE FOR LOW NOISE HIGH ELECTRON MOBILITY TRANSISTORS BY METAL ORGANIC VAPOR PHASE EPITAXY

(76) Inventors: Daniel P. Docter, 2405 34th St., #9, Santa Monica, CA (US) 90405; Kenneth R. Elliott, 2735 Queens Way, Thousand Oaks, CA (US) 91362

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/861,435
(22) Filed: May 21, 1997
(51) Int. Cl.$^7$ .................................................. H01L 21/336
(52) U.S. Cl. ............................ 438/285; 438/503; 438/972
(58) Field of Search ..................... 438/285, 503, 438/972, FOR 256; 117/94, 90; 427/99, 314, 444

(56) References Cited

U.S. PATENT DOCUMENTS

| | | |
|---|---|---|
| 3,969,164 * | 7/1976 | Cho et al. . |
| 4,451,691 * | 5/1984 | Fraas . |
| 4,689,869 * | 9/1987 | Jambotkar et al. . |
| 4,732,648 * | 3/1988 | Fronius et al. . |
| 4,738,934 * | 4/1988 | Johnston, Jr. et al. . |
| 5,034,344 * | 7/1991 | Jewell et al. . |
| 5,164,040 * | 11/1992 | Eres et al. . |
| 5,213,906 * | 5/1993 | Le Corre et al. . |
| 5,399,521 * | 3/1995 | Celii et al. . |
| 5,456,205 * | 10/1995 | Sheldon . |
| 5,548,137 * | 8/1996 | Fan et al. . |
| 5,598,015 * | 1/1997 | Tanoue et al. . |
| 5,603,765 * | 2/1997 | Matloubian et al. . |
| 5,756,375 * | 5/1998 | Celii et al. . |
| 5,818,859 * | 10/1998 | Miller et al. . |

* cited by examiner

Primary Examiner—George Fourson
(74) Attorney, Agent, or Firm—V. D. Duraiswamy; M. W. Sales

(57) ABSTRACT

A method of making material layers for semiconductor devices by metal organic vapor phase epitaxy includes the steps of wafer preparation, oxide desorption, growth and post growth with an accompanying reduction of a residual sheet charge at the substrate-epitaxy interface. During the oxide desorption step, a substrate is heated to a temperature minimlly necessary to remove oxide from the substrate. In accordance with such method, material layers for a low noise high electron mobility transistor (HEMT) can be grown without a bulk, buffer layer immediately adjacent the substrate. Rather, a super lattice structure is immediately adjacent to and between the substrate and a channel layer.

11 Claims, 3 Drawing Sheets

GROWTH TECHNIQUE FOR LOW NOISE HIGH ELECTRON MOBILITY TRANSISTORS BY METAL ORGANIC VAPOR PHASE EPITAXY

This invention was made with Government support under MDA 972-94-3-0025 awarded by the Government. The Government has certain rights in this invention.

BACKGROUND OF THE INVENTION

1. Field of the Invention

The present invention generally relates to growth by metal organic vapor phase epitaxy (MOVPE) of semiconductor devices and, more particularly, to an improved method of reducing residual or unintentional sheet charge occurring in metal organic vapor phase epitaxy (MOVPE) grown semiconductor devices, and semiconductor devices in general and low noise high electron mobility transistors (LN HEMT) and other charge or leakage sensitive devices, in particular, produced by such improved method.

2. Description of Related Art

High electron mobility transistors (HEMTs), and particularly low noise high electron mobility transistors (LN HEMTs), are used for microwave and millimeter low noise amplifiers, as well as other RF applications. These components have been used in various environments such as radar, satellites, and cellular telephones. Growing lattice-matched and pseudomorphic materials for HEMT devices and other charge sensitive devices has continued to become of more interest through the use of metal organic vapor phase epitaxy (MOVPE) and molecular beam epitaxy (MBE).

As is recognized in the art, however, the production of HEMT by MBE generally is more expensive than production by MOVPE. In particular, the cost differential results from the fact that current MOVPE commercial reactors allow for the growth of more HEMTs at one time than MBE reactors. Commercially available MOVPE reactors now handle up to about 20 wafers or substrates at a time while MBE reactors only handle up to about 5 wafers or substrates. Therefore, in the context of larger scale production, cost becomes a significant issue when comparing the benefits of MOVPE versus MBE. As such, there has been greater interest in MOVPE than in MBE.

Conventional methods of processing using MOVPE, however, have presented performance issues which have been associated with a residual or unintentional charge at the substrate-epilayer interface. The conventional wisdom for growing InP-based and GaAs-based materials by MOVPE has been to use growth temperatures of approximately 625 degrees C. or higher. Conventional thinking has been that higher quality material is obtained in this temperature range than at lower temperatures. The residual surface charge creates n-type conduction in the epilayers which, in turn, affects the pinch-off voltage, transconductance ($G_m$), the unity current-gain cutoff frequency ($f_T$), and the maximum frequency of oscillation ($f_{max}$) of the device. An increased residual charge causes larger pinch-off voltages. Likewise, the transconductance and unity current-gain cutoff frequency degrade with increasing interface charge, and the degradations result in lower frequency, higher noise, and higher power consumption in the device.

In addressing the need to minimize the residual sheet charge, an iron doped buffer layer has previously been grown directly adjacent to the substrate. The Fe doping creates deep levels which offset the effects of shallow donors that otherwise result in n-type conduction. The buffer layer is then semi-insulating. However, the Fe dopant is itself an undesirable contaminant which can migrate into the device layers. Also, the buffer layer has previously been made relatively thick (around the order of 3,000 Å) to isolate the device from the effects of the residual sheet charge. However, the need for a buffer layer, and particularly a thick buffer layer, tends to increase costs and production time of the HEMT.

As can be seen, there is a need for improved methods of MOVPE which lower the residual charge and, hence, provide higher quality material with lower production time and costs. There is also a need for improved lattice-matched or pseudomorphic material for HEMT devices which are thinner than the current art and have a lower residual surface charge and thereby better performance characteristics.

SUMMARY OF THE INVENTION

The present invention is directed to an improved method of making materials by MOVPE. The invention provides an improved LN HEMT which is both lattice-matched and pseudomorphic. More specifically, the present invention satisfies the need of minimizing a residual or sheet charge at the substrate-epilayer interface of the device, in addition to reducing the time and costs of growing devices by MOVPE. The improved method includes minimizing the sheet charge by heating the substrate to an oxide desorption temperature which is minimally necessary to result in sufficient oxide desorption of the substrate. Sufficient desorption is evidenced by a preferred crystalline morphology in the grown epilayers. More specifically, the preferred crystalline morphology is evidenced by a uniform surface with no obvious features under microscopic examination The oxide desorption temperature is between about 500 to 575 degrees C. over a heating period of about 3 to 7 minutes. The epilayers are then grown at a growth temperature that is approximately the same as or less than the oxide desorption temperature. The improved HEMT which can be grown according to the method of this invention does not require the use of a bulk, buffer layer immediately adjacent to the substrate to minimize the sheet charge. Instead, a thin super lattice buffer structure is grown adjacent to the substrate to provide a smooth growth front from the substrate to a channel layer and to minimize charge from background doping.

These and other features, aspects and advantages of the present invention will become better understood with reference to the following drawings, description, and claims.

DETAILED DESCRIPTION OF THE INVENTION

Figure 1:
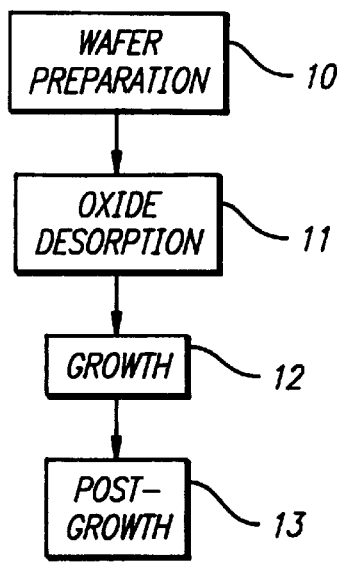
FIG. 1 is a flowchart depicting the steps of an embodiment of the present invention.

The overall steps of an embodiment of the present invention is shown in FIG. 1. A commercially available metal organic vapor deposition epitaxy (MOVPE) reactor is used to carry out the steps of the present invention, such as those manufactured by Emcore, Aixtron, and Thomas Swan. However, the process of the present invention is not intended to be limited to commercially available MOVPE reactors. Rather, commercial reactors are mentioned for ease of practicing the invention. As indicated in FIG. 1, a wafer or substrate preparation step 10 takes place in accordance with those practices well known in the art. Generally, the wafer or substrate is subjected to degreasing, etching, and cleaning of the surface. Then, the substrate is subjected to an oxide desorption step 11 whereby the surface oxide is removed from the substrate. Various layers of the device are then grown in a growth step 12, as is also known in the art and described, for example, in J. B. Stringfellow, Organometallic Vapor-Phase Epitaxy, Academic Press (1989). Thereafter, in a post-growth step 13, the substrate is cooled and removed from the reactor. The process shown in FIG. 1 can produce various devices, such as the HEMT depicted in FIG. 2.

In utilizing an Emcore model D180 reactor to practice this embodiment of the invention, calibration runs are made. Calibration runs usually include bulk layers of a single material type (i.e., 1 $\mu$m of InGaAs). Post growth analysis of these layers includes Nomarski photographs to inspect the surface morphology for high quality crystalline growth. The preferred crystalline morphology is evidenced by a uniform surface with no obvious features under microscopic examination. Hall measurements determine resistivity and more importantly mobility and charge concentrations for doped structures. X-ray diffraction determines the degree of lattice match of the bulk grown epilayer and the substrate. Step profiling determines the thickness and hence growth rate of the bulk grown epilayer.

In more particularly describing the steps shown in FIG. 1, three inch indium phosphide wafers or substrates are provided. Although the wafer preparation step 10 can be carried out, such step 10 can be essentially omitted by the use of commercially available epi-ready wafers which have been prepared for immediate introduction into an MOVPE reactor. For example, the present invention contemplates the use of epi-ready wafers from Sumitomo and preferably Crystacomm epi-ready (100) wafers. The substrate is placed into the introduction chamber of the reactor and the pressure is then allowed to reach about $2 \times 10^{-6}$ torr. Then, the substrate is transferred into the growth chamber.

When the substrate is initially placed in the growth chamber, the oxide desorption step 11 occurs. During such step 11, and for the preferred embodiment employed in this invention, the growth chamber is maintained at about 35 torr. Of course, the preferred pressure may change depending upon the particular model reactor used. In any event, when the pressure is below or above about 35 torr for the Emcore reactor, then there is non-uniformity and wide variations of growth in the layers. The oxide desorption step 11 includes the step of heating the substrate to an oxide desorption temperature which is minimally necessary to remove a sufficient amount of oxide from the substrate. Such sufficient removal is evidenced by a preferred morphology (i.e., crystalline growth) of the layers which can be seen upon microscopic examination of the completed device. The conventional wisdom for growing InP-based and GaAs-based materials by MOVPE has been to use growth temperatures of approximately 625 degrees C. or higher. Conventional thinking has been that higher quality material is obtained in this termperature range than at lower temperatures. High quality material at lower growth temperatures as evidenced by the device performance in this invention was unexpected.

With such minimally necessary heat for oxide desorption in the present invention, the activation of silicon, which exists as silicon oxide on the substrate 15, is minimized. In other words, the production of shallow donors due to silicon activation is minimized. The existence of silicon on GaAs and InP surfaces is known in the art, but the present invention contemplates that other substrate compositions can present similar contamination.

Figure 2:
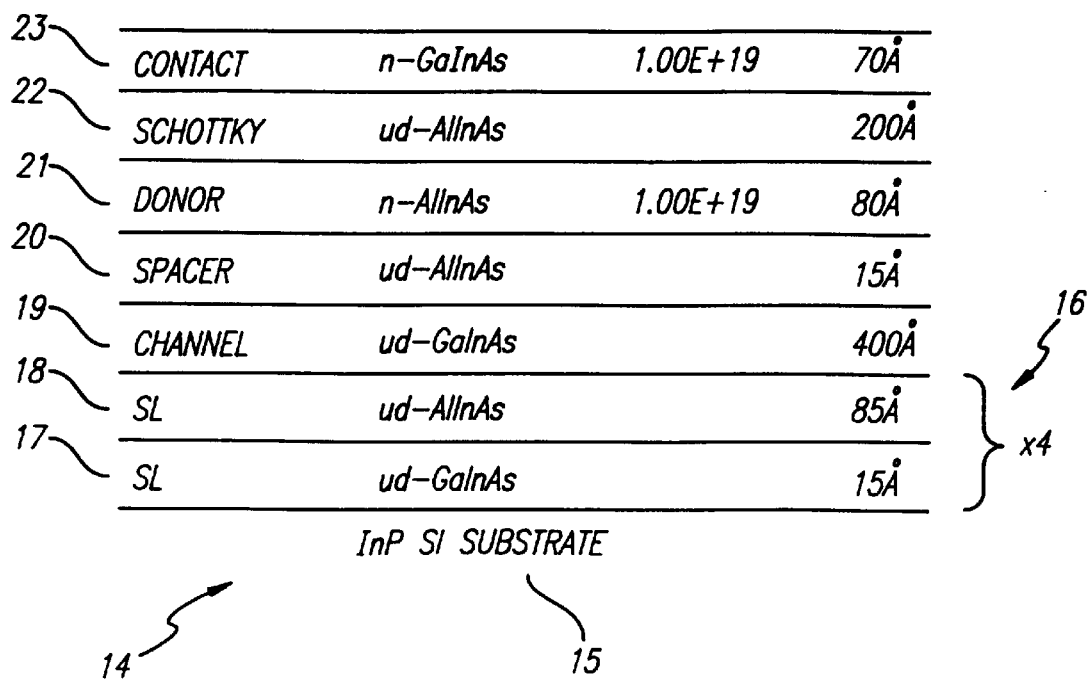
FIG. 2 is a cross-sectional diagram of a HEMT according to an embodiment of the present invention.

For the HEMT shown in FIG. 2, and irrespective of the specific growth chamber pressure, the oxide desorption temperature preferably ranges from about 500 to 575 degrees C. Optimally, the oxide desorption temperature is about 550 degrees C. Generally, a temperature which is less than about 500 degrees C. does not adequately result in oxide removal; therefore, subsequent growth does not proceed in a crystalline fashion, i.e., poor morphology. Above about 575 degrees C., the sheet or residual surface charge becomes undesirably high. The desirability is, of course, qualitative, but those in the art often find an acceptable residual charge to be around $2.0 \times 10^{10}$ cm$^{-2}$.

Within the above oxide desorption temperature range, the substrate undergoes oxide desorption over a desorption period of about 3 to 7 minutes, with an optimal time of about 5 minutes when the oxide desorption temperature is about 550 degrees C. At less than about 1 minute, there tends to be an inadequate amount of desorption, as evidenced by a poor morphology under microscopic examination of the completed device. For a desorption period in excess of about 10 minutes, the desorption process has already passed the point of substantial completion and, thus, further desorption has minimal benefit and leads to increased silicon activation.

For the particular embodiment of the invention shown in FIG. 2, the source materials are AsH$_3$, PH$_3$, trimethylaluminum (TMAl), trimethylgallium (TMGa), trimethylindium (TMIn), and triethyltin (TESn). Purified H$_2$ is the carrier gas.

Briefly, for growth (FIG. 1, step 12), the following growth steps that lead up to and include oxide desorption are executed using controlling software program(s):

1. Establish the reactor growth process conditions. This includes setting the reactor pressure, setting the hydrogen shroud flow into the reactor, setting the hydrogen carrier gas flow to bypass the metalorganic source bubblers and the hydride and alkyl injection blocks, starting the flow of hydrides to be used to vent, setting the pressure for the metalorganic source bubblers and the hydride and alkyl injection blocks, and setting the wafer platter rotation speed. The hydrogen shroud and wafer platter rotation are ramped to their setpoints over 3 minutes. The remaining parameters are set immediately.

2. Ramp the substrate temperature to 400 C over 2 minutes. Stabilize at this temperature before continuing (5 minutes).

3. Switch the hydrogen carrier gas flow to pass through the bubblers and flow to vent.

4. Switch the PH$_3$ hydride flow to the reactor. Ramp the substrate temperature to 550 C over 3 minutes under a PH$_3$ overpressure.

5. Sit at 550 C for 5 minutes to desorb the oxide.

6. Turn on the AsH$_3$ hydride flow to vent.

Also, for this embodiment of the invention, the growth step 12 is carried out at a growth temperature that approximates or is less than the oxide desorption temperature. The controlling software program executes the following growth steps for a growth rate of 1.0 $\mu$m per hour:

7. Switch the TMIn, TEGa, and AsH$_3$ to the reactor and turn off the PH$_3$. Grow for 0.09 minutes. 8. Switch the TEGa to vent and TMAl to reactor. Grow for 0.51 minutes.

9. Repeat step 7–8 three more times.

10. Switch the TEGa to reactor and TMAl to vent. Grow for 2.4 minutes.

11. Switch the TEGa to vent and TMAl to reactor. Grow for 0.09 minutes.

12. Switch the TESn to reactor. Grow for 0.48 minutes.

13. Switch the TESn to vent. Grow for 1.2 minutes.

14. Switch the TEGa to reactor, TMAl to vent, and TESn to reactor. Grow for 0.42 minutes.

As can be appreciated, an omission of one or more layers to be grown can reduce the overall growth period and accompanying costs of production. For example, using a typical growth rate of 1 $\mu$m/hour, the elimination of a 5,000 Å buffer layer for a three inch wafer can result in a thirty minute reduction in the total growth period. When the time and cost savings is placed in the context of large scale production, the savings become significant.

Following the completion of the growth step 12, the post-growth step 13 includes purging the growth chamber with H$_2$ gas, in this embodiment of the invention. The substrate is then allowed to cool to room temperature. The resulting device, for example, can be the HEMT shown in FIG. 2.

The process depicted in FIG. 1 is preferably used to produce material for lattice-matched HEMT and pseudomorphic HEMT (p-HEMT) (collectively referred to as HEMT). However, the present invention contemplates that it can be utilized for producing a variety of charge sensitive and leakage sensitive devices. What is intended by the phrase "charge sensitive device" is a device which is degraded by unintentional or background charges. For example, some charge sensitive devices include MESFETs, HIGFETs, and HFETs. The reference to "leakage sensitive devices" is intended to refer to those devices which are sensitive to leakage currents between layers of the device. Some leakage sensitive devices include charge coupled devices and dynamic RAM cells.

While referring to FIG. 2, the HEMT device 14 is comprised of a substrate 15, a super lattice buffer structure 16, a channel layer 19, a spacer layer 20, a donor layer 21, a schottky layer 22, and a contact layer 23. The particular compositions of those layers and structures, together with their functions, are well known in the art and described, for example, in J. B. Stringfellow, Organometallic Vapor-Phase Epitaxy, Academic Press (1989). Further, while FIG. 2 shows the layers and structures as being formed of particular compounds, it should be understood that other compounds are contemplated. As is known in the art, the particular compounds being used in any one layer is dependent upon the particular substrate 15 being used and particular device 14 being formed. Therefore, while FIG. 2 shows the use of an InP substrate 15 with an InGaAs/InAlAs material system, the present invention envisions devices having material systems using, among others, GaAs, AlGaAs, InGaAsP, GaAlSbAs, AlAsSb, GaAsSb, GaPSb, AlPSb, InGaAlP, and InGaAsSb.

In referring to FIG. 2, the substrate 15, in this embodiment of the invention, is made of indium phosphide. The present invention, however, contemplates that the substrate 15 can be made of other materials. In particular, the present invention envisions the use of substrates that tend to produce a residual or sheet charge. By way of example, the sheet charge producing substrates can be made of gallium arsenide and indium phosphide.

Immediately adjacent to the substrate 15 is the super lattice structure 16 which is intended to provide a smooth growth front between the substrate 15 and the channel layer 19. In this embodiment, the super lattice structure 16 is composed of multiple super lattice layers 17, 18 which alternate between one and the other. Although the total number of layers 17, 18 may vary, as is known in the art, this embodiment of the invention preferably includes a total of eight layers in the structure 16. The super lattice layer 17 is made of undoped gallium indium arsenide and with a thickness from about 10 to 20 Å and preferably about 15 Å. Similarly, the super lattice layer 18, as shown if FIG. 2, is made of undoped aluminum indium arsenide and with a thickness from about 80 to 90 Å and preferably about 85 Å thick. Again, however, the thicknesses of each layer can vary. As is practiced in the art, any one layer or period in a super lattice structure often varies from about 20 to 200 Å. Still, the present invention contemplates that the super lattice buffer 16 is substantially precluded from growing (i.e., substantially reduced in thickness) when compared to the prior practice. The preferred thickness is about 600 Å or less, if one assumes an acceptable sheet charge of about $3.0 \times 10^{10}$ cm$^{-2}$ and a background impurity of about $5.0 \times 10^{15}$ cm$^{-3}$.

This embodiment of the invention preferably omits a bulk, buffer layer immediately adjacent to the substrate 15. As has been practiced in the art, a bulk buffer layer is commonly disposed immediately adjacent to the substrate and is often of a thickness around 3,000 to 5,000 Å. Such a buffer layer possesses electrical properties which are not substantially different between a relatively thin layer and an infinitely thick layer. By omitting a bulk, buffer layer in this embodiment of the invention, not only is the cost and time of production reduced, but a reduction in n-type conduction is also accomplished. The reduction of n-type conduction is seen by the absence of unintentional background impurity doping that is typically present in a buffer layer and that oftentimes provides a source of contaminants into the channel layer.

Nothwithstanding the above, a bulk, buffer layer can still be employed in practicing this invention. In such instance, the bulk, buffer layer is substantially precluded from growing (i.e., substantially reduced in thickness) when compared to what has been practiced in the past. Just as with the super lattice buffer 16, a bulk, buffer layer is preferably made about 600 Å or less thick. Thereby, a bulk, buffer layer can be used in lieu of the super lattice buffer 16 since both act as a "buffer" which can be generally defined as a semiconducting layer which shields the conducting layer from the effects of the substrate in a semiconductor device.

In this preferred embodiment of the invention, the super lattice structure 16 is followed by the channel layer 19 which supports electron flow or conduction. In this embodiment, the channel layer 19 is made of undoped gallium indium arsenide and preferably about 400 Å thick, although the thickness can range from about 200 to 400 Å. The spacer layer 20 is then provided immediately adjacent to the channel layer 19 such that the spacer layer 20 provides separation from the donor layer 21, which can act as a scattering mechanism for electron conduction. As indicated in FIG. 2, the spacer layer 20 is made of undoped aluminum indium arsenide.

The donor layer 21 is disposed immediately adjacent to the spacer layer 20 and made of doped n-type aluminum indium arsenide. As the electron source, the donor layer 21 ranges from about 40 to 100 Å thick and preferably about 80 Å thick. The schottky layer 22 provides a wider energy bandgap barrier to support a better schottky gate contact. The layer 22 is of undoped aluminum indium arsenide. For this embodiment, the thickness of the schottky layer 22 ranges from about 100 to 400 Å and is preferably about 200 Å. The contact layer 23 provides a contact area for the source and drain and is of doped n-type gallium indium arsenide. For this embodiment, the thickness of the layer 23 ranges from about 50 to 100 Å and is preferably about 70 Å.

EXAMPLES

Tests were conducted on the embodiment of the present invention shown in FIG. 2. An Emcore model D180 reactor was used to grow the devices in accordance with the invention shown in FIG. 1. Crystacomm epi-ready (100) wafers were used. The method of growth was carried out in accordance with the controlling software program that accompanies the D180 model reactor. Hall measurements were used to determine background or residual sheet charge. The results are shown in Table 1 below.

TABLE 1

| Run # | Desorp/growth temp (C) | Buffer thickness (Å) | Residual sheet charge (cm$^{-2}$) |
|---|---|---|---|
| 97042 | 720/650 | 2500 | 2.05 × 10$^{12}$ |
| 97043 | 720/750 | 0 | 1.43 × 10$^{12}$ |
| 97049 | 550/550 | 0 | 9.62 × 10$^{9}$ |
| 97059 | 575/575 | 0 | 4.63 × 10$^{10}$ |

For run # 97042 in Table 1, a HEMT was grown in accordance with the embodiment shown in FIG. 2, except that an undoped AlInAs buffer layer of about 2,500 angstroms thick was grown immediately adjacent the substrate and prior to growing the super lattice structure. Table 1 indicates that the other tests were run without such a buffer layer. It can be seen that as the oxide desorption temperature was increased, the residual sheet charge increased. Run # 97049 which used an oxide desorption temperature and growth temperature of 550 degrees C. provided the most desirable residual sheet charge of the tests without a buffer layer.

Given the fact that the test results in Table 1 indicated that an oxide desorption/growth temperature of 550 degrees C. was desirable in terms of residual sheet charge, multiple tests were run at 550 degrees C. Again, the devices were grown with Crystacomm epi-ready (100) wafers in an Emcore model D180 reactor using its controlling software program. Electron mobility (measured in units of cm$^2$/Volt second), in addition to channel sheet charge (units of cm$^{-2}$), were determined by Hall measurements. The tests were based upon the embodiment shown in FIG. 2, with the results shown in Table 2 below.

TABLE 2

| Run # | Desorp/growth temp (C) | Channel Sheet charge (cm$^{-2}$) | Mobility (cm$^2$/Vs) |
|---|---|---|---|
| 97050 | 550/550 | 3.54 × 10$^{10}$ | 11,662 |
| 97055 | 550/550 | 3.32 × 10$^{12}$ | 10,617 |
| 97057 | 550/550 | 2.33 × 10$^{12}$ | 11,396 |
| 97060 | 550/550 | 2.65 × 10$^{12}$ | 11,027 |
| 97061 | 550/550 | 2.98 × 10$^{12}$ | 11,012 |

Figure 3:
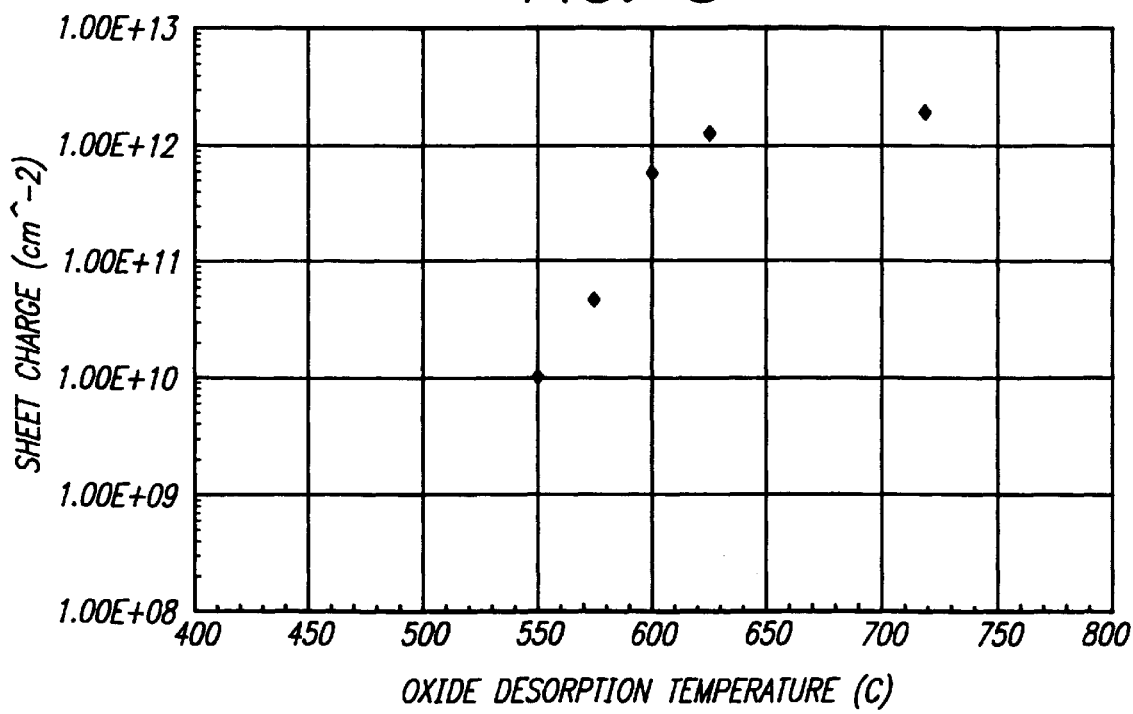
FIG. 3 is a graph of sheet charge vs. oxide desorption temperature for various HEMT according to the embodiment of the present invention indicated in FIG. 2.

Additional test results are shown in FIG. 3 which is a graph of residual sheet charge versus oxide desorption temperature. Some of the data points in FIG. 3 are taken from Table 1. The devices tested were grown with Crystacomm epi-ready (100) wafers in an Emcore model D180 reactor in accordance with the embodiment shown in FIG. 2. The layers were grown using the reactor's controlling software program. Hall measurements were used to determine the residual charge. Except for the data point having a desorption temperature of about 720 degrees C., all tests were conducted with a desorption temperature being substantially the same as the growth temperature. At a 720 degree C. desorption temperature, the growth temperature was about 650 degrees C. For each test, the desorption period was about 5 minutes at a pressure of about 35 torr. At the desorption temperature of 720 degrees C., however, the desorption period was about 15 minutes. FIG. 3 again indicates that as the desorption temperature drops, the residual charge drops. As the desorption temperature falls below about 625 degrees C. and particularly below about 575 degrees C., the residual charge starts to more significantly drop off. At a desorption temperature of about 550 degrees C., the residual charge is at its lowest.

Figure 4:
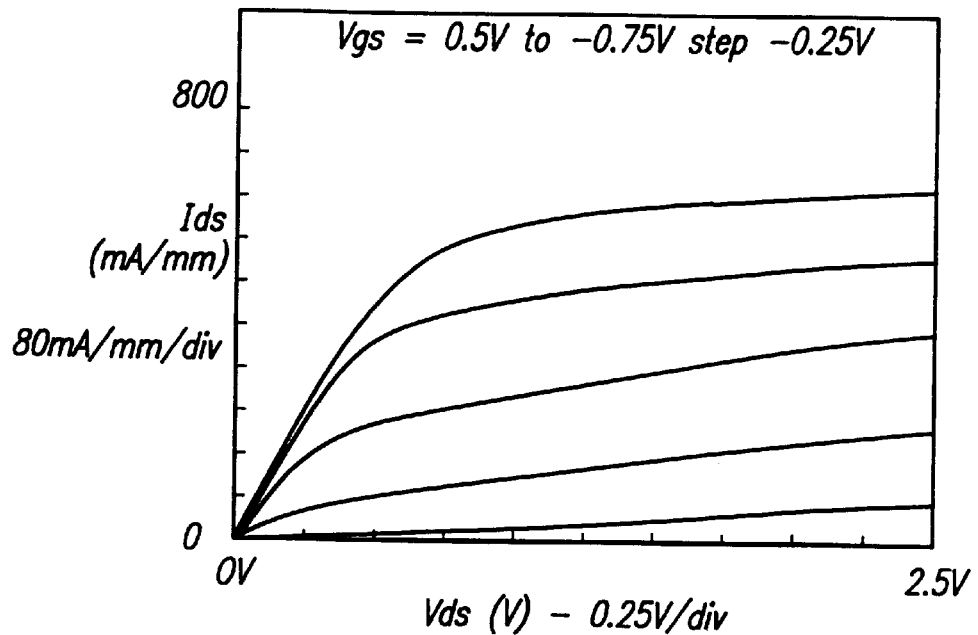
FIG. 4 is a graph of drain current vs. drain voltage for several HEMT according to the embodiment of the present invention indicated in FIG. 3 but which was only grown at an oxide desorption temperature of about 550 degrees C.

FIG. 4 is a drain current versus drain voltage (I-V) graph of test results for HEMT devices grown in an Emcore model D180 reactor and in accordance with that shown in FIG. 2. The desorption/growth temperature was about 550 degrees C. Tests were run with devices having a gate length of 0.12 μm and at varying gate voltages. The gate voltages ranged from 0.50 to −0.50 V with increments of 0.25 V. The top curve in FIG. 4 is for a gate voltage of 0.50 V and the bottom curve is for a gate voltage of −0.50 V. The test results indicate that the drain current $I_{dss}$ (bias conditions $V_{ds}$=1 V and $V_{gs}$=0 V) is 255 mA/mm and the maximum drain current $I_{d,\,max}$ (bias conditions $V_{ds}$=1 V and $V_{gs}$=0.2 V) is 401 mA/mm. Those I-V characteristics are virtually identical to those of similar devices by MBE. The comparison to MBE is due to the absence of numerous devices by MOVPE.

Figure 5:
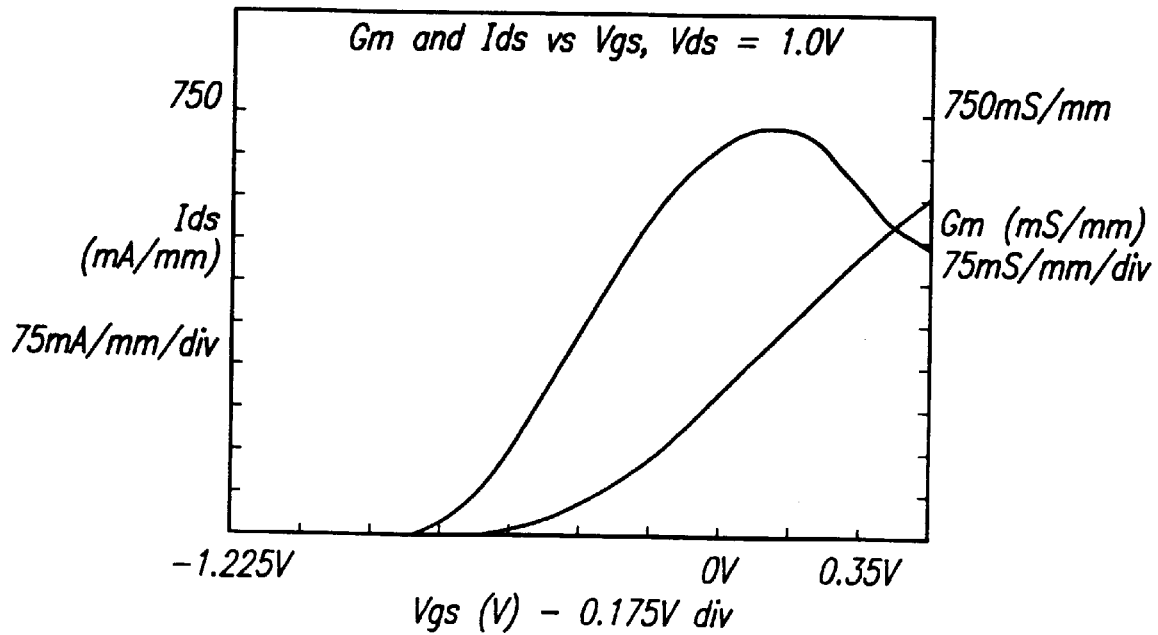
FIG. 5 is a graph of gate current vs. gate voltage and transconductance vs. gate voltage for a HEMT according to the embodiment of the present invention indicated in FIG. 4.

FIG. 5 is a gate current versus gate voltage and transconductance versus gate voltage graph of test results for a HEMT device grown from a Crystacomm epi-ready (100) wafer in an Emcore model D180 reactor and in accordance with that shown in FIG. 2. The desorption/growth temperature was about 550 degrees C. The gate length was 0.12 μm. The test results indicate the pinch-off voltage, $V_{po}$ (bias conditions $V_{ds}$=1 V and $I_d$=1 mA/mm) is −0.7 V and the maximum transconductance $G_{m,\,max}$ is 730 mS/mm. The $G_m$ and $I_d$ characteristics are virtually identical to those of similar devices grown by MBE.

Figure 6:
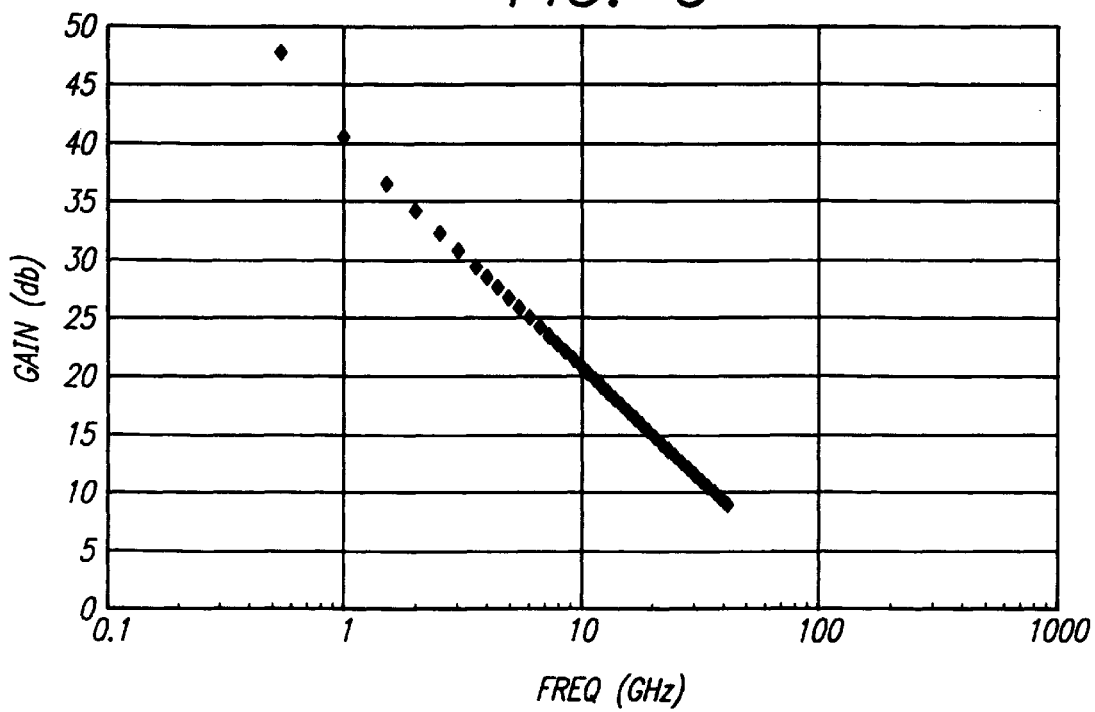
FIG. 6 is a graph of current gain vs. frequency for a HEMT according to the embodiment of the present invention indicated in FIG. 4.

FIG. 6 is a gain (dB) versus frequency of operation (GHz) graph of test results for HEMT devices grown from Crystacomm epi-ready (100) wafers in an Emcore model D180 reactor and in accordance with that shown in FIG. 2. The desorption/growth temperature was about 550 degrees C. Tests were run with devices having a gate length of 0.12 μm. The test results indicate that the extrapolated unity current-gain cutoff frequency ($f_T$) is about 108 Ghz, which is, again, virtually identical to similar devices grown by MBE.

It should be understood, of course, that the foregoing relates to preferred embodiments of the invention and that modifications may be made without departing from the spirit and scope of the invention as set forth in the following claims.

What is claimed is:

1. An improved method of metal organic vapor phase epitaxy for growing material layers in a high electron mobility transistor, comprising the steps of:

providing an indium phosphide substrate which has a residual surface charge;

heating said substrate at an oxide desorption temperature which is minimally necessary to result in oxide desorption of said substrate and thereby minimize a production of shallow donors in said substrate while contaminants remain directly on said substrate, said oxide desorption temperature being between about 550 to 575 decrees C.; and growing layers of compounds by metal organic chemical vapor deposition on said substrate at a growth temperature that is the same as said oxide desorption temperature, whereby said residual surface charge is minimized.

2. An improved method of growing materials in a high electron mobility transistor, comprising the steps of:

providing an indium phosphide substrate within a chamber;

minimizing a residual surface charge on said substrate to not more than about $3.0 \times 10^{10}$ $cm^{-2}$ by controlling an oxide desorption temperature during removal of oxide from said substrate and while activation of silicon contaminants remaining directly on said substrate is minimized, said oxide desorption temperature being at a temperature that is minimally sufficient to achieve said residual surface charge; and growing layers of compounds by metal organic chemical vapor deposition on said substrate, the step of growing occurring at a growth temperature that is equal to said oxide desorption temperature, whereby a buffer layer of not more than about 600 Å thick is immediately adjacent to said substrate, said buffer layer shielding a conducting layer in said transistor from the electrical effects of said substrate.

3. The method of claim 2 wherein said step of controlling said oxide desorption temperature results in a minimization of activation of a shallow donor producing material on said substrate.

4. The method of claim 3 wherein said shallow donor producing material is silicon.

5. The method of claim 2 wherein said oxide desorption temperature is between about 500 to 575 degrees C.

6. The method of claim 2 wherein said growth temperature is between about 500 to 575 degrees C.

7. The method of claim 2 wherein said buffer layer is a super lattice buffer structure.

8. An improved method of growing material layers for a high electron mobility transistor, comprising the steps of:

providing an indium phosphide substrate;

minimizing a residual surface charge on said substrate, said step of minimizing including the step of heating said substrate at an oxide desorption temperature that is not greater than about 575° C. and which is minimally necessary to result in crystalline growth of layers of compounds on said substrate while minimizing the production of shallow donors in said substrate and while minimizing an activation of silicon contaminants that remain directly on said substrate during the step of heating; and limiting the growth by metal organic chemical vapor deposition of a buffer layer immediately adjacent to said substrate, said buffer layer having a thickness of not more than about 600 Å and shielding a conducting layer in said transistor from the electrical effects of said substrate.

9. The method of claim 8 wherein said transistor has a lattice-matched structure.

10. The method of claim 8 wherein said transistor has a pseudomorphic structure.

11. The method of claim 1 wherein said oxide desorption temperature is between about 500 to 575 degrees C.

* * * * *

UNITED STATES PATENT AND TRADEMARK OFFICE
CERTIFICATE OF CORRECTION

| | | |
|---|---|---|
| PATENT NO. | : 6,214,678 B1 | Page 1 of 1 |
| DATED | : April 10, 2001 | |
| INVENTOR(S) | : Daniel P. Docter | |

It is certified that error appears in the above-identified patent and that said Letters Patent is hereby corrected as shown below:

<u>Title page,</u>
After the listed inventors insert item [73] as follows: -- [73] Assignee: Hughes Electronics Corporation, El Segundo, Calif. --.

Signed and Sealed this

Twenty-eighth Day of August, 2001

Attest:

NICHOLAS P. GODICI
*Attesting Officer*     *Acting Director of the United States Patent and Trademark Office*